United States Patent
Choi et al.

(10) Patent No.: US 6,594,174 B2
(45) Date of Patent: Jul. 15, 2003

(54) METHOD FOR SENSING DATA STORED IN A FERROELECTRIC RANDOM ACCESS MEMORY DEVICE

(75) Inventors: Mun-Kyu Choi, Kyunggi-do (KR); Byung-Gil Jeon, Kyunggi-do (KR); Ki-Nam Kim, Kyunggi-do (KR)

(73) Assignee: Samsung Electric Co., Ltd., Suwon (KR)

( * ) Notice: Subject to any disclaimer, the term of this patent is extended or adjusted under 35 U.S.C. 154(b) by 0 days.

(21) Appl. No.: 10/003,528

(22) Filed: Oct. 30, 2001

(65) Prior Publication Data

US 2002/0136049 A1 Sep. 26, 2002

(30) Foreign Application Priority Data

Mar. 5, 2001 (KR) ........................................ 2001-11133

(51) Int. Cl.[7] .............................................. G11C 11/22
(52) U.S. Cl. .................................. 365/145; 365/189.09
(58) Field of Search ................................. 365/145, 205, 365/149, 189.09

(56) References Cited

U.S. PATENT DOCUMENTS

| | | | | |
|---|---|---|---|---|
| 5,844,832 A | * | 12/1998 | Kim ............................ | 365/145 |
| 6,067,265 A | * | 5/2000 | Mukunoki et al. .......... | 365/145 |
| 6,288,931 B1 | * | 9/2001 | Kye et al. ................... | 365/145 |

* cited by examiner

*Primary Examiner*—Huan Hoang
(74) *Attorney, Agent, or Firm*—Marger Johnson & McCollom P.C.

(57) ABSTRACT

A ferroelectric random access memory device of the present invention includes an access transistor having a gate connected to a word line and a current path connected between a bit line and an internal cell node. A ferroelectric capacitor is connected between the internal cell node and a plate line. A reference voltage generator for generating a reference voltage includes a linear paraelectric capacitor. Data stored in the ferroelectric capacitor is sensed by activating the word line so as to connect the ferroelectric capacitor to the bit line. The plate line is then activated and simultaneously reference capacitor is connected to a complementary bit line. After a voltage difference between the bit line and the complementary bit line is detected, the reference capacitor is insulated from the complementary bit line.

16 Claims, 6 Drawing Sheets

METHOD FOR SENSING DATA STORED IN A FERROELECTRIC RANDOM ACCESS MEMORY DEVICE

This application claims priority from Korean Patent Application No. 2001-011133, filed on Mar. 5, 2001, the contents of which are herein incorporated by reference in their entirety.

FIELD OF THE INVENTION

The present invention relates to a nonvolatile memory device and, more particularly, to a method of sensing the data stored in a ferroelectric memory device including a memory cell comprising a ferroelectric capacitor and an access transistor.

BACKGROUND OF THE INVENTION

A ferroelectric random access memory uses a ferroelectric capacitor to store memory cell data. Each memory cell stores a logic state based on electric polarization of the ferroelectric capacitor. The ferroelectric capacitor has a dielectric including a ferroelectric such as PZT (lead zirconate titanate) between two electrodes. When a voltage is applied to each plate of the ferroelectric capacitor, the ferroelectric is polarized in a field direction. A coercive voltage changes the polarization state of the ferroelectric capacitor. The ferroelectric capacitor operates with hysteresis, and current flows to the capacitor in accordance with the polarization state. If the applied voltage is greater than the coercive voltage, the ferroelectric capacitor will change the polarization state in accordance with a polarity of the applied voltage. The polarization state can be maintained after removing the power source, resulting in non-volatility. The ferroelectric capacitor changes between the polarization states within a short time, e.g., about 1 ns. The programming time of the ferroelectric memory device is faster than that of most other non-volatile memory devices such as erasable programmable read only memories (EPROMs), electrically erasable programmable read only memories (EEPROMs), and flash EEPROMs.

A conventional ferroelectric random access memory device is shown in FIG. 1. Referring to FIG. 1, the conventional ferroelectric random access memory device includes a memory cell array 10 comprising a plurality of ferroelectric memory cells, e.g. cells 11 and 12. The memory cell array 10 comprises a first ferroelectric memory cell M1 and a second ferroelectric memory cell M2. The first and second ferroelectric memory cells 11 and 12, respectively, each in turn comprise an access transistor (or pass transistor) and a ferroelectric capacitor More specifically, in the first ferroelectric memory cell 11, an access transistor M1 has a gate connected to a first word line WL0. A current path exists between one electrode of the ferroelectric capacitor CF1 (referred to as a first internal cell node) and a first bit line BL0. The ferroelectric capacitor CF1 is connected between the first internal cell node and a plate line PL. In the second ferroelectric memory cell 12, an access transistor M2 has a gate connected to a second word line WL1. A current path exists between one electrode of the ferroelectric capacitor CF2 (referred to as a second internal cell node) and a second bit line BL1. The ferroelectric capacitor CF2 is connected between the second internal cell node and the plate line PL. Adjacent memory cells are arranged along other rows and share one plate line between them.

A reference voltage generator 20 is connected to the bit lines BL0 and BL1. The reference voltage generator 20 provides a reference voltage to either one of the bit lines BL0 or BL1. The reference voltage generator 20 comprises of three NMOS transistors MN1-MN3 and a reference capacitor RCF. Current paths of the NMOS transistors MN2 and MN3 are connected in series between the bit lines BL0 and BL1 and their gates are connected to corresponding control signals DMP0 and DMPE, respectively. The reference capacitor RCF is connected between a common node ND1 of the NMOS transistors MN2 and MN3 and a ground voltage. The NMOS transistor MN1 has a gate connected to a control signal DMPRS and a current path connected between a voltage line transmitting a reference voltage VREF and the common node ND1 of the NMOS transistors MN2 and MN3. In one embodiment, the reference capacitor RCF is a linear paraelectric capacitor.

FIG. 2 is a timing diagram of signals associated with the conventional ferroelectric random access memory device. A method for sensing data stored in the conventional ferroelectric random access memory device is as follows. First, word line, e.g. WL0, is activated to high level and the ferroelectric capacitor CF1 is connected to the bit line BL0 (to be referred to as main bit line hereinafter) through the access transistor M1 connected to the word line WL0. As the control signal DMPRS is pulsed, a predetermined reference voltage VREF is charged to the reference capacitor RCF of the reference voltage generator 20. By application of the pulse signal to the plate line PL, an electric field between the plate line PL and the main bit line BL0 is applied to the both electrodes of the ferroelectric capacitor CF1. As a result, a predetermined charge is excited in the main bit line in accordance with data (e.g. data '1') stored in the ferroelectric capacitor CF1. As the signal line DMPE is pulsed, the reference voltage VREF is transmitted to the bit line BL1 (to be referred to reference bit line hereinafter) through the NMOS transistor MN2. Since latch enable signals SAN and SAP are activated to a low and high level, respectively, a sense amplifier 30 detects a change of charge applied to the bit line BL0 by using the reference voltage supplied to the bit line BL1. As the detected result, a voltage of the main bit line BL0 goes to a power supply voltage Vcc level or a ground voltage GND level.

The method described above has a disadvantage. Since the loading capability of the main bit line BL0 is larger than that of the reference bit line BL1 at sensing time (when the latch enable signals SAN and SAP are activated), the data sensing margin (or a voltage difference between the main bit line and the reference bit line) is reduced. More specifically, before the latch enable signals SAN and SAP are transferred, the reference capacitor RCF is electrically insulated from the reference bit line BL1 of the reference voltage generator 20 by a high-to-low transition of the control signal DMPE. Before and after the latch enable signals SAN and SAP are transferred, while the reference bit line BL1 is insulated from the reference capacitor RCF, the main bit line BL0 is electrically connected to the ferroelectric capacitor CF1 of the memory cell. As shown in FIG. 3A, the reference bit line rises up more rapid than the main bit line. That is, when voltages of the main and the reference bit lines BL0 and BL1 attain the power supply voltage Vcc and the ground voltage GND (or ground voltage and power supply voltage), respectively, the data sensing margin is reduced. In the worst case, data '1' may be detected as data '0' because the voltage level of the main bit line BL0 is lower than that of the reference bit line BL1 as shown in FIG. 3B.

SUMMARY OF THE INVENTION

An object of the present invention is to overcome the disadvantages of the prior art.

Another object of the present invention is to provide a constant sensing margin when sensing data in a semiconductor memory device.

Yet another object of the present invention is to maintain equal the loading capability of a bit line with that of a complementary bit line when sensing data in a semiconductor memory device.

According to an aspect of the present invention, a ferroelectric random access memory device includes an access transistor having a gate connected to a word line and a current path connected between a bit line and internal cell node. A ferroelectric capacitor is connected between the internal cell node and a plate line. A reference voltage generator generates a reference voltage and includes a reference capacitor. Data is sensed in the ferroelectric capacitor by activating the word line so as to connect the ferroelectric capacitor to the bit line. After the plate line is activated, the reference capacitor is connected to a complementary bit line thereby developing a voltage difference between the bit line and the complementary bit line. The reference capacitor is insulated from the complementary bit line. The reference capacitor is equal or similar to that of the ferroelectric capacitor, and the reference of a linear paraelectric capacitor.

According to another aspect of the present invention, a ferroelectric memory device includes an access transistor having a gate connected to a word line and a current path connected between a bit line and an internal cell node. A ferroelectric capacitor is connected between the internal cell node and a plate line. A reference voltage generator for generating a reference voltage includes a reference capacitor. Data stored in the ferroelectric memory device is sensed by supplying the reference voltage to the reference capacitor, activating the word line so as to connect the ferroelectric capacitor to the bit line, activating the plate line, and simultaneously connecting the reference capacitor to the complementary bit line so as to supply the reference voltage. A sensing a voltage difference is sensed between the bit line and the complementary bit line. The reference capacitor is insulated from the complementary bit line. The word line is inactivated. The reference capacitor has a size equal or similar to that of the reference capacitor. The reference capacitor of a linear paraelectric capacitor.

According to yet another aspect of the present invention, a ferroelectric memory device includes a first memory cell having a first access transistor having a gate connected to a first word line and a current path connected between a bit line. A first ferroelectric capacitor is connected between the internal cell node and the plate line. A second memory cell having has a second access transistor with a gate connected to a second word line and a current path connected between a complementary bit line and internal cell node. A second ferroelectric capacitor is connected between the internal cell node and the plate line. A reference voltage generator for generating a reference voltage includes a reference capacitor. Data in the ferroelectric memory device is sensed by activating either one of the first or second word line so as to connect either one of the first or second ferroelectric capacitor to the bit line, activating the plate line and simultaneously connecting the reference capacitor to the complementary bit line. A voltage difference is sensed between the bit line and the complementary bit line and the reference capacitor is insulated from the complementary bit line.

According to yet another aspect of the present invention, a method for sensing data stored in the ferroelectric memory device is provided. The memory device includes a first memory cell having a first access transistor with a gate connected to a first word line and a current path connected between a bit line and an internal cell node. The device includes a first ferroelectric capacitor connected between the internal cell node and the plate line. A second memory cell has a second access transistor with a gate connected to a second word line and a current path connected between a complementary bit line and an internal cell node. A second ferroelectric capacitor is connected between the internal cell node and the plate line. A reference voltage generator for generating a reference voltage includes a reference capacitor. Data stored in the device is sensed by precharging the bit line and the complementary bit line, putting the bit line and the complementary bit line into floating states, activating either one of the first or second word line so as to connect either one of the first or second ferroelectric capacitor to the bit line, activating the plate line and simultaneously connecting the reference capacitor to a complementary bit line, sensing a voltage difference between the bit line and the complementary bit line, insulating the reference capacitor from the complementary bit line, and inactivating the activated word line. In one embodiment, the reference capacitor has a size equal or similar to that of the ferroelectric capacitor, and the reference capacitor is formed of a linear paraelectric capacitor.

Thus, before and after the sensing operation is carried out, the bit line has the same loading capability with a complementary bit line by electrically connecting a reference capacitor of the reference voltage generator to the complementary bit line.

BRIEF DESCRIPTION OF THE DRAWINGS

The present invention will be more clearly understood from the description of the preferred embodiments as set forth below with reference to the accompanying drawings.

DESCRIPTION OF THE PREFERRED EMBODIMENTS

Figure 1:
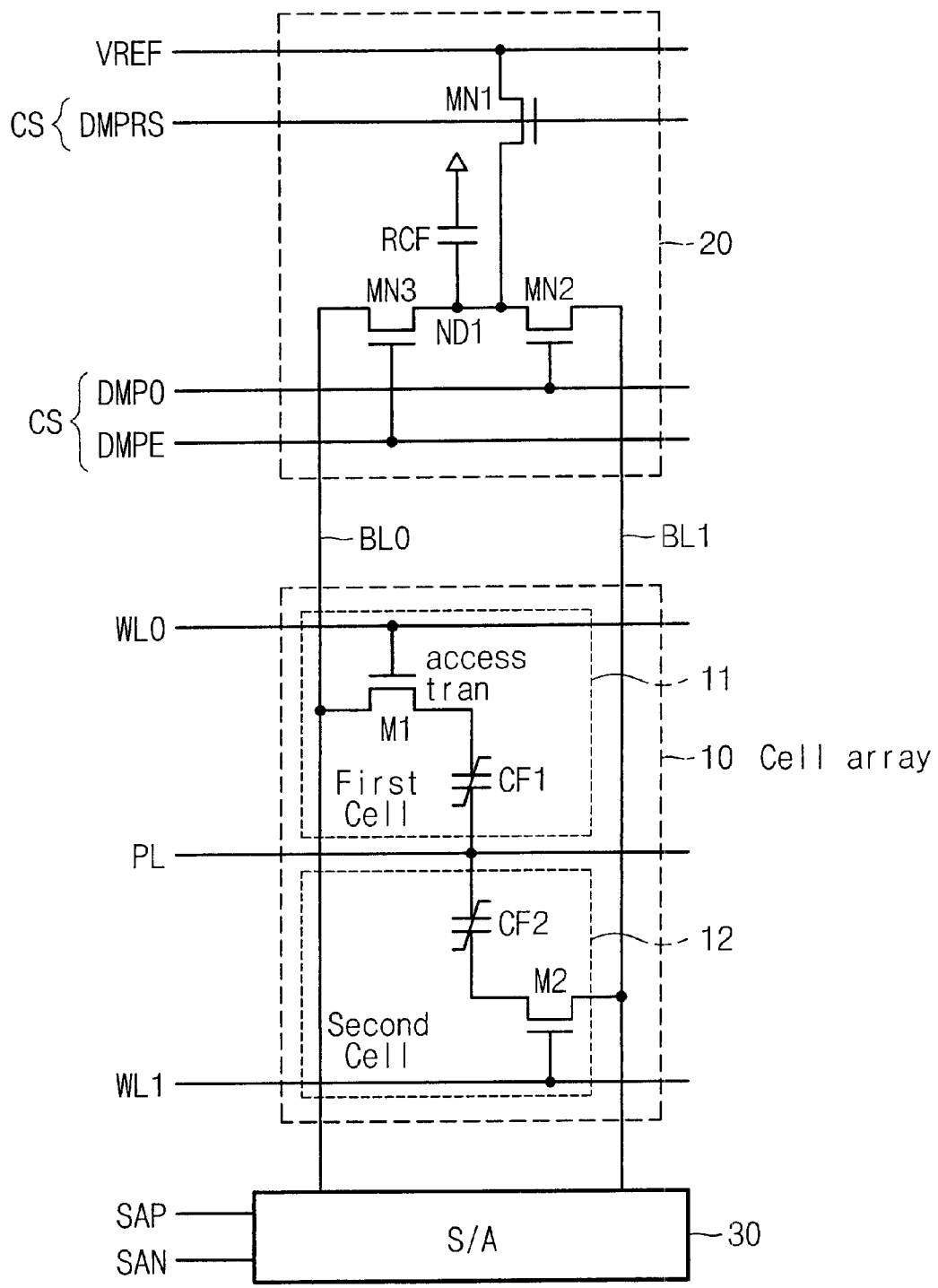
FIG. 1 is a block diagram illustrating a conventional ferroelectric random access memory device.
Figure 2:
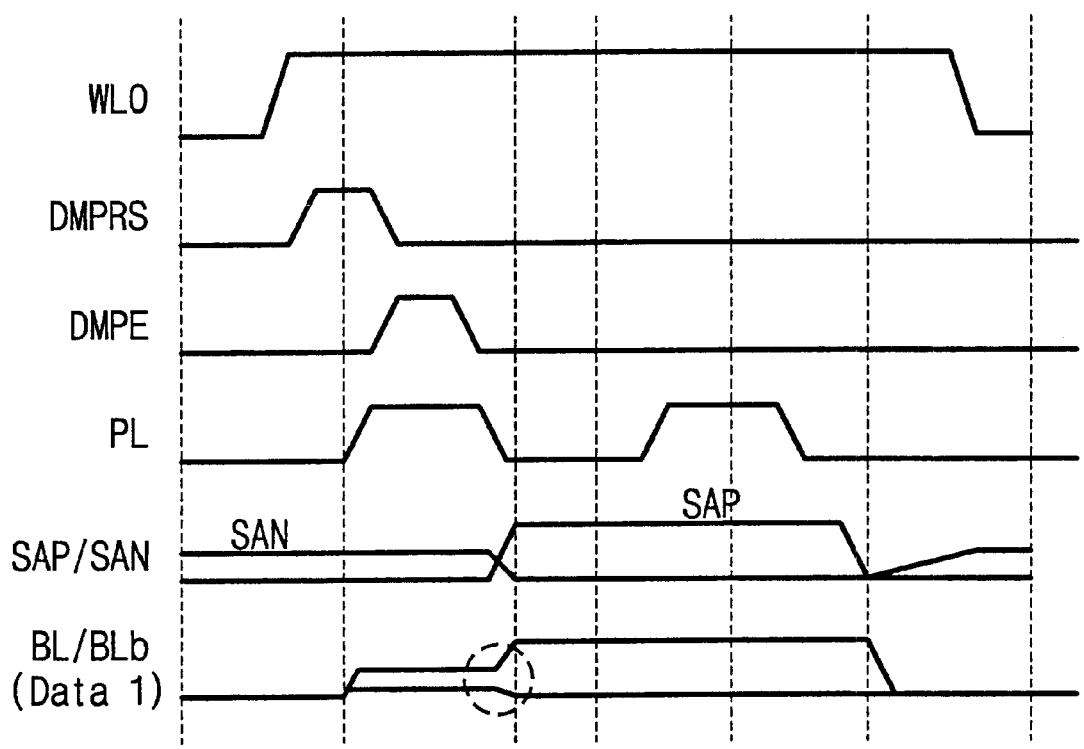
FIG. 2 is a timing diagram of the signals associated with the ferroelectric random access memory device of FIG. 1.
Figure 3A:
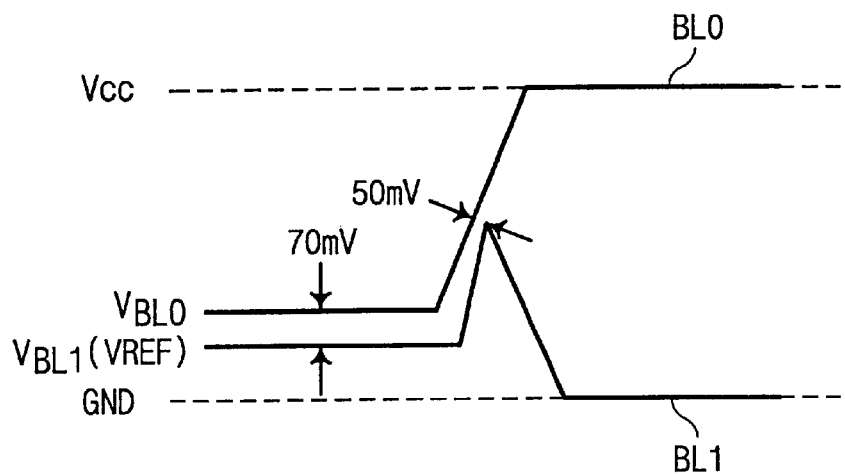
FIGS. 3A and 3B are enlarged diagrams of dotted line portions of FIG. 2 explaining disadvantages associated with the conventional sensing method.
Figure 3B:
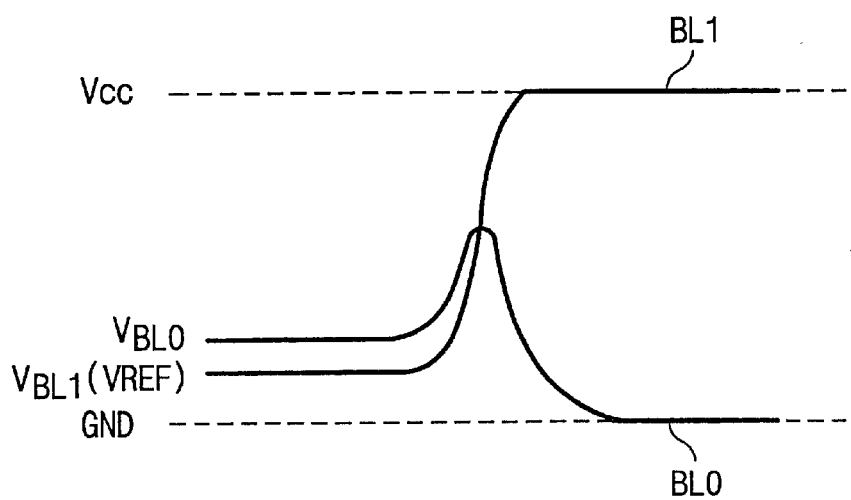
Figure 4:
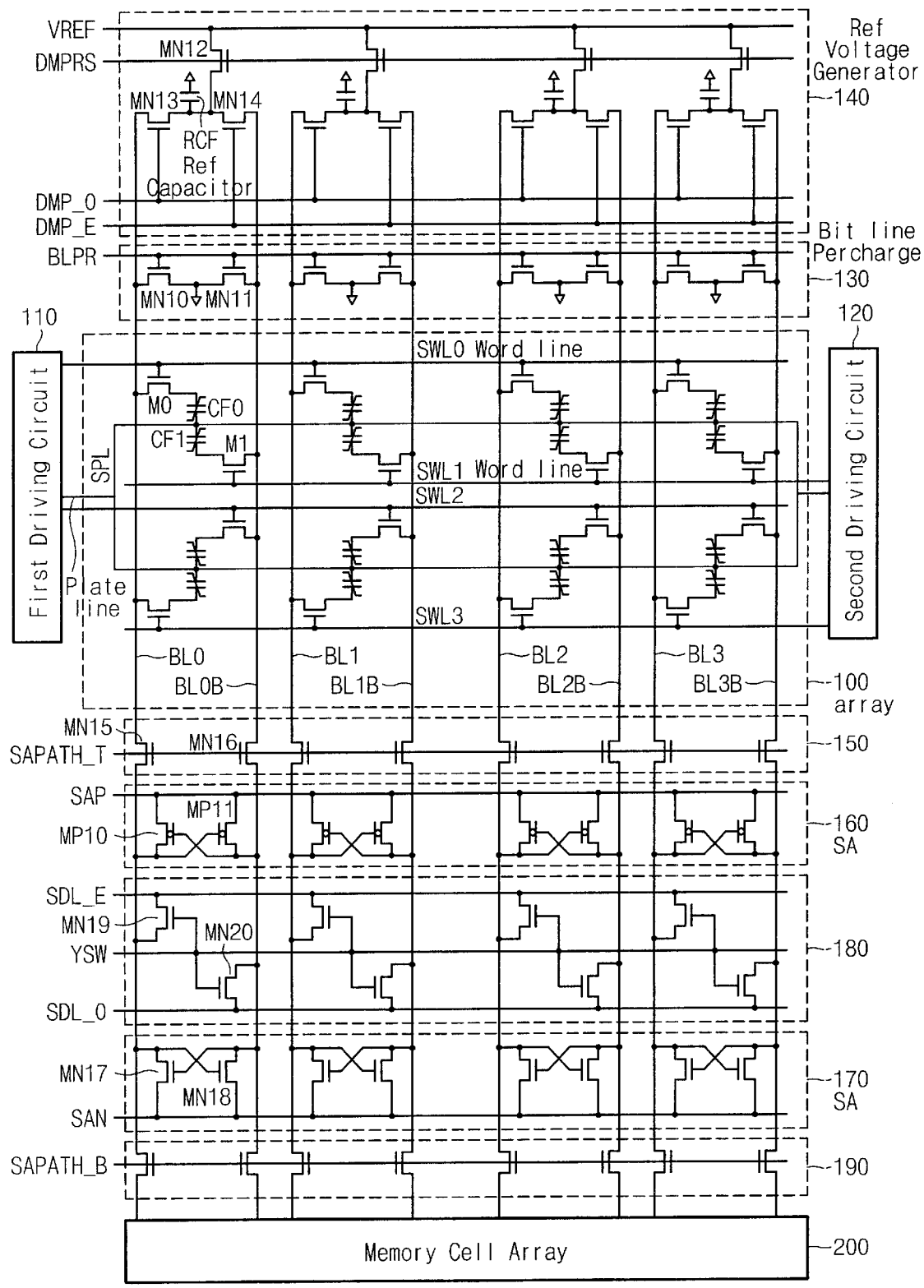
FIG. 4 is a block diagram of a ferroelectric random access memory device in accordance with the present invention.
Figure 5:
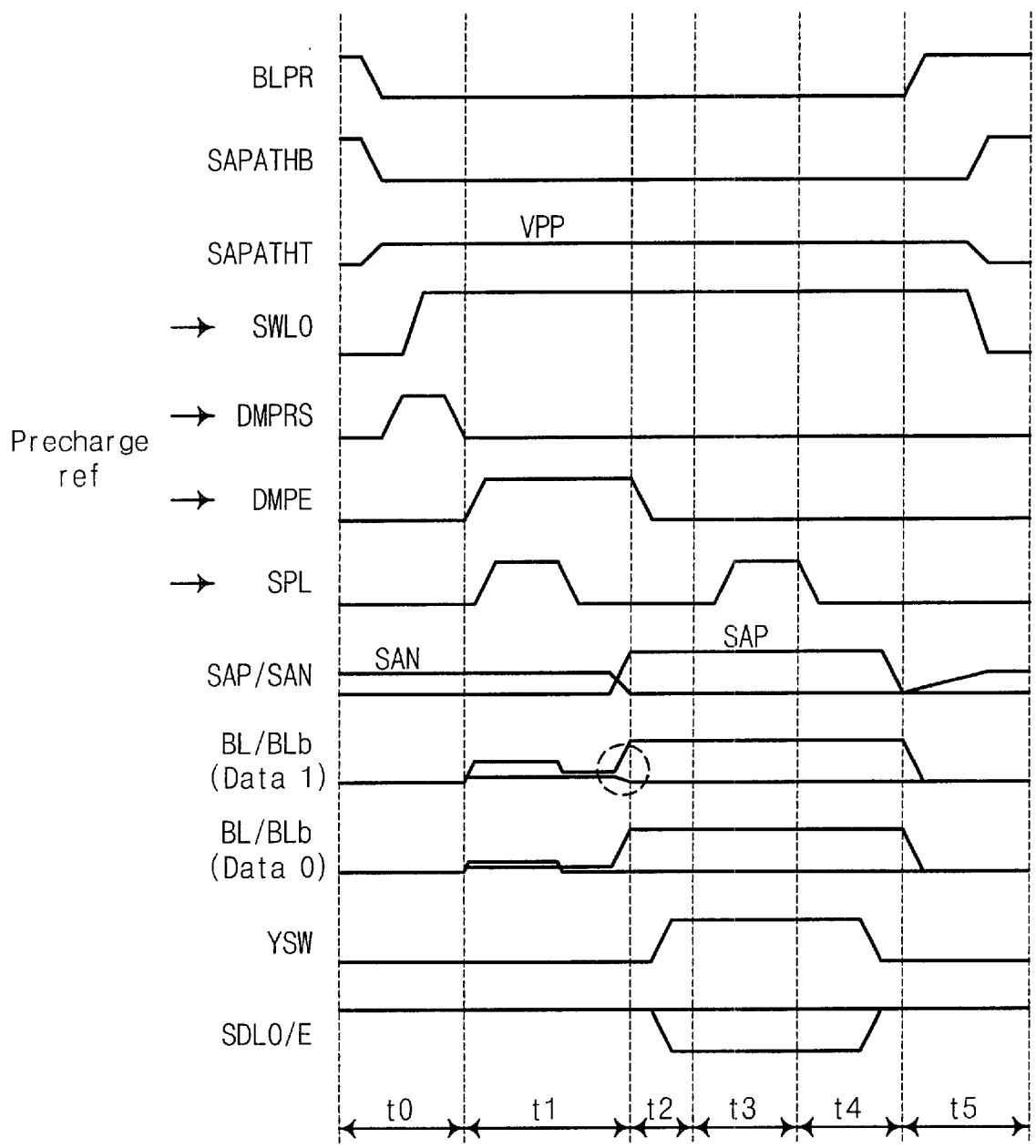
FIG. 5 is a timing diagram of signals associated with the ferroelectric random access memory device of FIG. 4.
Figure 6:
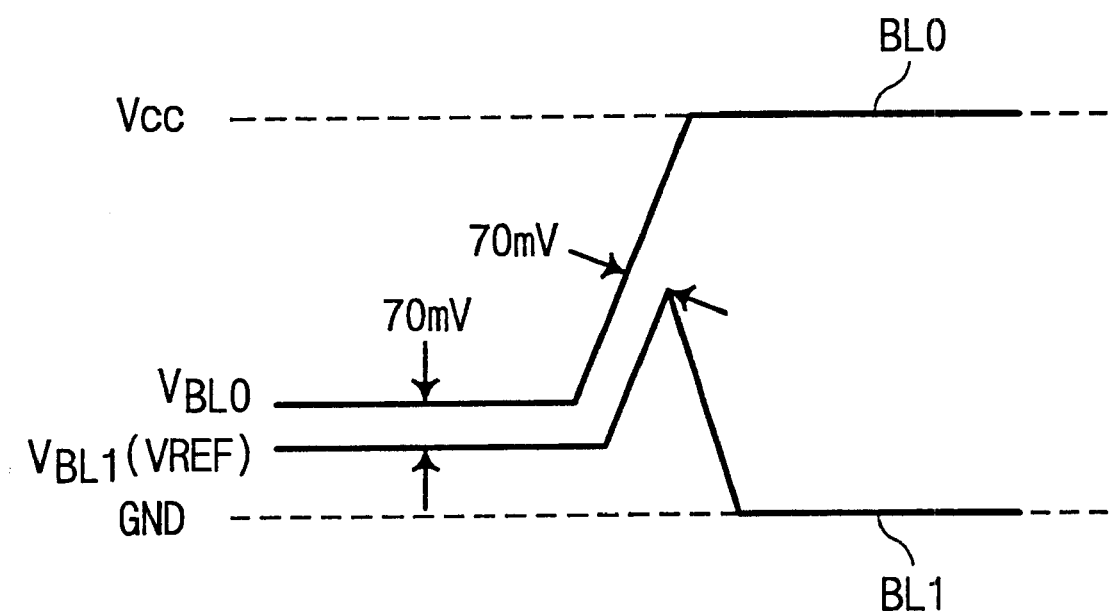
FIG. 6 is an enlarged diagram of dotted line portions of FIG. 5.

Referring now to FIGS. 4 to 6, a ferroelectric random access memory device of the present invention has a folded bit line structure and a method for sensing data capable of obtaining a constant (or uniform) data sensing margin by similarly loading a bit line and a complementary bit line. A pulse signal is applied to a plate line connected to a ferroelectric capacitor of a selected memory cell. Simultaneously, a reference capacitor of a reference voltage generator is electrically connected to the complementary bit line. After activating latch enable signals representative of a sensing operation or after a potential difference between the bit line and the complementary bit line is sufficiently detected, the reference capacitor is electrically insulated from the complementary bit line.

FIG. 4 is a block diagram of a ferroelectric random access memory device in accordance with the present invention. The memory device includes a memory cell array 100. For convenience, the memory cell array 100 shows four word lines SWL0–SWL3 and four pairs of bit lines of [BL0, BL0B], [BL1, BL1B], [BL2, BL2B], and [BL3, BL3B]. Ferroelectric memory cells are arranged in at the intersection of the word lines and the four pairs of bit lines. Each ferroelectric memory cell is composed of one access transistor and one ferroelectric capacitor. Configuration of one pair of bit lines [BL0, BL0B] will be described below for convenience. However, it is apparent that other pairs of bit lines are similarly constructed.

Referring to FIG. 4, the access transistor M0 whose gate is connected to the word line SWL0 has a current path connected between the bit line BL0 and one electrode of the ferroelectric capacitor CF0. The other electrode of the capacitor CF0 is connected to a plate line SPL. The access transistor M1 has a gate connected to the word line SWL1 has a current path connected between the bit line BL0B and one electrode of the ferroelectric capacitor CF1. The other electrode of the capacitor CF1 is connected to the plate line SPL. The access transistor M0 has a gate connected to the word line SWL2 and a current path connected between the bit line BL0 and one electrode of the ferroelectric capacitor CF0. The other electrode of the capacitor CF0 is connected to the plate line SPL. The access transistor M1 has a gate connected to the word line SWL3, and a current path connected between the bit line BL0B and one electrode of the ferroelectric capacitor CF1. The other electrode of the ferroelectric capacitor CF1 is connected to the plate line SPL.

Ferroelectric memory cells are connected to four word lines SWL0–SWL3 and arranged to share one plate line SPL. The word lines SWL0 and SWL2 are activated by a first driving circuit 110 and the word lines SWL1 and SWL3 are activated by a second driving circuit 120. Only one of the four word lines SWL0–SWL3 is activated and the plate line SPL is controlled by a driving circuit linked to a selected word line.

A bit line precharge circuit 130 is connected to the bit lines BL0 and BL0B. The precharge circuit 130 comprises two NMOS transistors MN10 and MN11. Current paths of the NMOS transistors MN10 and MN11 are connected in series between the bit lines BL0 and BL0B. Gates of the transistors MN10 and MN11 are connected so as to receive a control signal BKPR. A common node of the transistors MN10 and MN11 is connected to a ground voltage.

A reference voltage generator 140 is connected to the bit lines BL0 and BL0B. The reference voltage generator 140 comprises three NMOS transistors MN12, MN13, and MN14 and a reference capacitor RCF. Current paths of the NMOS transistors MN13 and MN14 are connected in series between the bit lines BL0 and BL0B. Gates of the transistors MN13 and MN14 are connected to corresponding control signals DMP0 and DMPE, respectively. The reference capacitor RCF is connected between a common node of the transistors MN13 and MN14 and ground voltage. The NMOS transistor MN12 has a gate connected to a control signal DMPRS and a current path connected between a reference voltage VREF line and the common node of the transistors MN13 and MN14. In one embodiment, the reference capacitor RCF is a linear paraelectric capacitor having a size or capacitance equal to that of the ferroelectric capacitor.

The bit lines BL0 and BL0B are connected to a P-latch sense amplifier 160 and a N-latch sense amplifier 170 through a first bit line insulation circuit 150. The first bit line insulation circuit 150 comprises two NMOS transistors MN15 and MN16 that are commonly controlled by a control signal SAPATHT. While the P-latch sense amplifier 160 comprises two PMOS transistors MP10 and MP11, the N-latch sense amplifier 170 comprises two NMOS transistors MN17 and MN18. The bit lines BL0 and BL0B are connected to corresponding data lines SDLE and SDL0 through a column selection circuit 180 comprising NMOS transistors MN19 and MN20.

As shown in FIG. 4, a memory cell array 200 (to be referred to as lower array hereinafter) has a similar configuration as the memory cell array 100 (to be referred to as upper array hereinafter). The lower array includes a driving circuits, a bit line precharge circuit, and a reference voltage generator (not shown). It is apparent that the lower array 200 is alternatively connected to the P-latch 160 or N-latch sense amplifier 170 by a second bit line insulation circuit 190.

FIG. 5 is a timing diagram of signals associated with a sensing operation of the ferroelectric random access memory device in accordance with the present invention. Assuming that the upper array 100 is selected, the sensing operation will be explain on the basis of the bit lines BL0 and BL0B.

The bit lines BL0 and BL0B are first precharged to a ground voltage through the bit line precharge circuit 130. During a time t0, the bit lines BL0 and BL0B are put into a floating states by a high-to-low transition of a control signal BLPR. The reference capacitor RFC of the reference voltage generator 140 is charged to a predetermined reference voltage VREF responsive to control signal DMPRS. Control signal DMPRS is a pulse signal in one embodiment. The word line (e.g. SWL0) is activated to a high level connecting one electrode of the ferroelectric capacitor CF0 to the main bit line BL0 via the access transistor M, in turn, connected to the word line SWL0.

At the beginning of a time t1, the plate line SPL is activated. Both electrodes of the ferroelectric capacitor CF0 receive an electric field from the plate line SPL to the main bit line BL0. Simultaneously, the control signal DMPE applied to the reference voltage generator 140 is activated to high. When the plate line SPL is activated, an electric charge corresponding to data (e.g. data '1') stored in the ferroelectric memory cell is excited in the main bit line BL0. When the control signal DMPE is activated, the reference voltage VREF charged in the reference capacitor RCF is transmitted to the reference bit line BL0B through the NMOS transistor MN14.

After the plate line SPL becomes low, the latch enable signals SAN and SAP go to low and high level, respectively. Further, the control signal DMPE is maintained to high level. As the latch enable signals SAN and SAP are activated to a low and a high level, respectively, change of the electric charge excited to the main bit line BL0 is detected by the sense amplifiers 160 and 170. In the case that data '1' is stored in the ferroelectric memory cell connected to selected word line SWL0, when the plate line SPL is activated to high, a potential of the main bit line BL0 becomes higher than that of the reference bit line BL0B. For example, before the sense amplifiers 160 and 170 operate, as shown in FIG. 6, a potential difference between the main bit line BL0 and the reference bit line BL0B is about 70 mV.

When the P-latch and N-latch sense amplifiers 160 and 170 are activated, voltages of the main and reference bit lines are increased at the same rising rate. When the increased voltage of the main bit line BL0 reaches a threshold voltage of the NMOS transistor, the NMOS transistor MN18 of the N-latch sense amplifier 170 is turned on, and a voltage of the reference bit line BL0B becomes the ground voltage GND. This is because that the control signal DMPE is maintained at an active state even after the sense amplifiers 160 and 170 operate. That is, because the ferroelectric capacitor is connected to the main bit line BL0 and the reference capacitor is connected to the reference bit line BL0B, the loading capability of the bit line BL0 is the same as the loading capability of the bit line BL0B. Thus, a data sensing margin can be maintained consistently.

After sensing the potential difference between the main bit line BL0 and the reference bit line BL0B, during a time t2, the control signal DMPE goes to low level, and the BL0B is electrically connected to the reference capacitor RCF. After that, cell data is transmitted to a data line, in the customary manner, by an activation of a control signal YSW through the column selection circuit 180.

Circuit configuration and operation are described as the above description and drawings, but it must be understood that other variations of the preferred embodiment are within the scope of this invention.

To equal the loads of the bit line and the complementary bit line, the reference capacitor of the reference voltage generator is electrically connected to the complementary bit line. A constant data sensing margin is obtained by detecting the potential difference between the bit line and the complementary bit line.

What is claimed is:

1. A method for sensing data stored in a ferroelectric memory device including an access transistor having a gate connected to a word line and a current path connected between a bit line and an internal cell node, a ferroelectric capacitor being connected between the internal cell node and a plate line, and a reference voltage generator connected across the access transistor and the ferroelectric capacitor for generating a reference voltage, the reference voltage generator including a reference capacitor, the method comprising:

precharging the reference capacitor to a reference voltage;

connecting the ferroelectric capacitor to the bit line responsive to the word line;

activating the plate line and simultaneously connecting the reference capacitor to the complementary bit line thereby transmitting the reference voltage to the complementary bit line;

sensing a voltage difference between the bit line and the complementary bit line; and insulating the reference capacitor from the complementary bit line.

2. The method of claim 1 wherein the reference capacitor has a size similar to a size of the ferroelectric capacitor.

3. The method of claim 1 wherein the reference capacitor is a linear paraelectric capacitor.

4. The method of claim 1 wherein the precharging occurs responsive to a precharge control signal.

5. The method of claim 4 wherein the precharge control signal is a pulse signal.

6. The method of claim 1 wherein coupling the ferroelectric capacitor includes interposing an access transistor between the bit line and the ferroelectric capacitor.

7. The method of claim 1 wherein simultaneously connecting includes interposing a reference transistor between the reference capacitor and the complementary bit line.

8. A method for sensing data stored in a ferroelectric memory device, the device including an access transistor having a gate connected to a word line and a current path connected between a bit line and an internal cell node, a ferroelectric capacitor connected between the internal cell node and a plate line, and a reference voltage generator having a reference capacitor, for generating a reference voltage, the method comprising:

supplying the reference voltage to the reference capacitor;

connecting the ferroelectric capacitor to the bit line by activating the wordline;

activating the plate line and simultaneously connecting the reference capacitor to a complementary bit line so as to supply the reference voltage to the complementary bit line;

sensing a voltage difference between the bit line and the complementary bit line;

insulating the reference capacitor from the complementary bit line; and inactivating the word line.

9. The method of claim 8, wherein the reference capacitor has a size about equal to a size of the reference capacitor.

10. The method of claim 8 wherein the reference capacitor is formed of a linear paraelectric capacitor.

11. A method for sensing data stored in a ferroelectric memory device, the device including a first memory cell, a second memory cell, and a reference voltage generator, the first memory cell having a first access transistor with a gate connected to a first word line and a current path connected between a bit line and a first ferroelectric capacitor connected between the internal cell node and the plate line, the second memory cell having a second access transistor with a gate connected to a second word line and a current path connected between a complementary bit line and the internal cell node and a second ferroelectric capacitor connected between the internal cell node and the plate line, and wherein the reference voltage generator generates a reference voltage and includes a reference capacitor, the method comprising:

precharging the reference capacitor with a reference voltage;

connecting the first ferroelectric capacitor to the bit line responsive to the first word line or the second ferroelectric capacitor to the bit line responsive to the second word line;

activating the plate line;

simultaneously with activating, connecting the reference capacitor to a complementary bit line thereby providing the reference voltage to the complementary bit line;

sensing a voltage difference between the bit line and the complementary bit line; and insulating the reference capacitor from the complementary bit line.

12. The method of claim 11 wherein a size of the reference capacitor is about equal to a size of the first or second ferroelectric capacitors.

13. The method of clam 11 wherein the reference capacitor is a linear paraelectric capacitor.

14. A method for sensing data stored in a ferroelectric memory device including a first memory cell, a second memory cell, and a reference voltage generator, the first memory cell having a first access transistor with a gate connected to a first word line and a current path connected between a bit line and a first ferroelectric capacitor connected between the internal cell node and the plate line, the second memory cell having a second access transistor with a gate connected to a second word line and a current path connected between a complementary bit line and the internal cell node and a second ferroelectric capacitor connected between the internal cell node and the plate line, and the reference voltage generator generating a reference voltage and having a reference capacitor, the method comprising:

precharging the bit line and the complementary bit line;

floating the bit line and the complementary bit line;

precharging the reference capacitor to a reference voltage;

activating either one of the first or second word lines so as to connect either one of the first or second ferroelectric capacitors to the bit line;

activating the plate line and simultaneously connecting the reference capacitor to the complementary bit line thereby providing the reference voltage to the complementary bit line;

sensing a voltage difference between the bit line and the complementary bit line;

insulating the reference capacitor from the complementary bit line; and inactivating the activated word line.

15. The method of claim 14 wherein a size of the reference capacitor similar to a size of the first or second ferroelectric capacitors.

16. The method of claim 14 wherein the reference capacitor is formed of a linear paraelectric capacitor.

* * * * *